United States Patent [19]

Yamagiwa et al.

[11] Patent Number: 4,549,132
[45] Date of Patent: Oct. 22, 1985

[54] METHOD OF TESTING AND VERIFYING A PERFORMANCE FOR INSULATION TO GROUND OF A DISCONNECTING SWITCH WHEN BREAKING A CHARGING CURRENT

[75] Inventors: Tokio Yamagiwa; Toshio Ishikawa; Jun Ozawa, all of Hitachi; Kaoru Endo, Ibaraki; Masao Hosokawa, Hitachi, all of Japan

[73] Assignee: Hitachi, Ltd., Tokyo, Japan

[21] Appl. No.: 523,086

[22] Filed: Aug. 15, 1983

[30] Foreign Application Priority Data

Aug. 20, 1982 [JP] Japan .................. 57-143417

[51] Int. Cl.[4] ........................... G01R 31/12
[52] U.S. Cl. ................................. 324/54
[58] Field of Search ................... 324/54, 51

[56] References Cited

U.S. PATENT DOCUMENTS 2,916,697 12/1959 Boode ........................ 324/54
2,923,879 2/1960 Povey ........................ 324/54
2,977,531 3/1961 Humes et al. ............... 324/54

OTHER PUBLICATIONS

Nishiwaki et al., Ground Fault by Restriking Surge of SF$_6$ Gas-Insulated Disconnecting Switch & Its Synthetic Tests, IEEE, 82 WM 187-3, 1982, pp. 1-9.

Primary Examiner—Stanley T. Krawczewicz
Attorney, Agent, or Firm—Antonelli, Terry & Wands

[57] ABSTRACT

There is disclosed a method of testing and verifying a performance for insulation to ground of a disconnecting switch when breaking a charging current. This disconnecting switch has a movable electrode and a fixed electrode which are arranged in a tank so as to face each other. One of these electrodes is connected to an electrostatic capacity load and the other is connected to a power supply. This test method comprises the steps of: applying a voltage from the power supply through the disconnecting switch to the load to cause the voltage to be trapped in the load; and applying a voltage of the polarity opposite to that of the trapped charged voltage from the power supply to the disconnecting switch to cause the discharge between those electrodes, thereby verifying the performance for insulation to ground.

9 Claims, 15 Drawing Figures

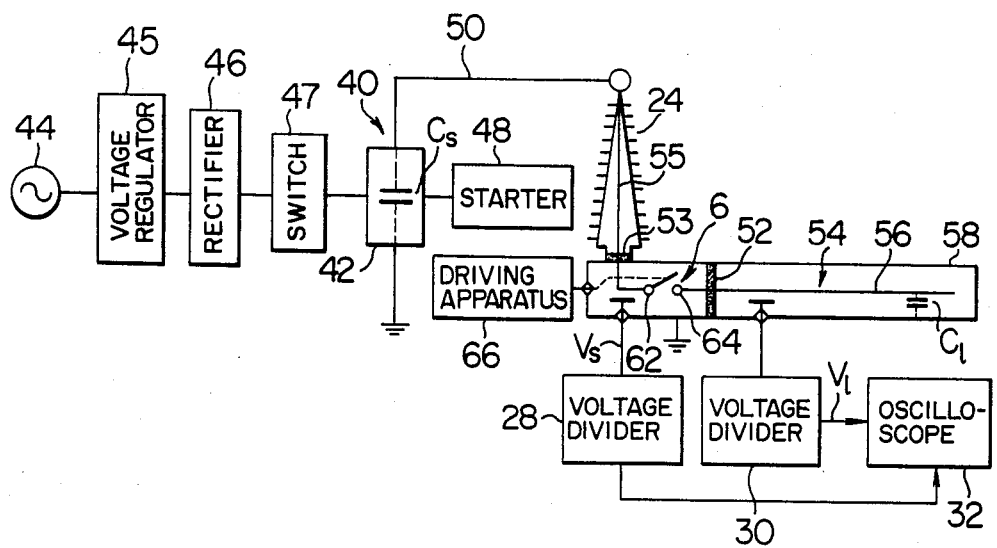
FIG. 4
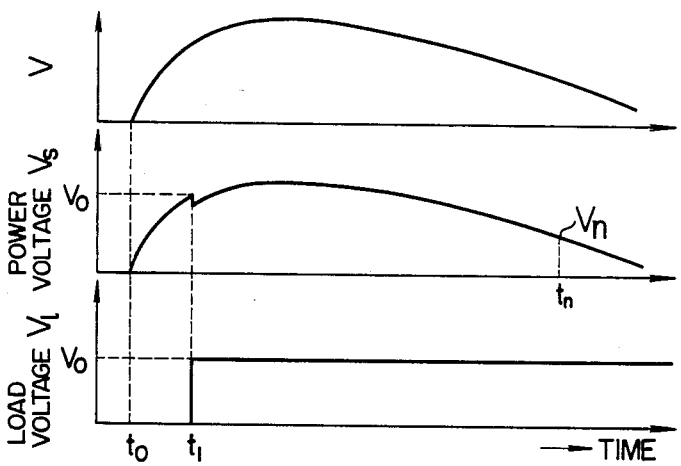
FIG. 5A
FIG. 5B
FIG. 5C

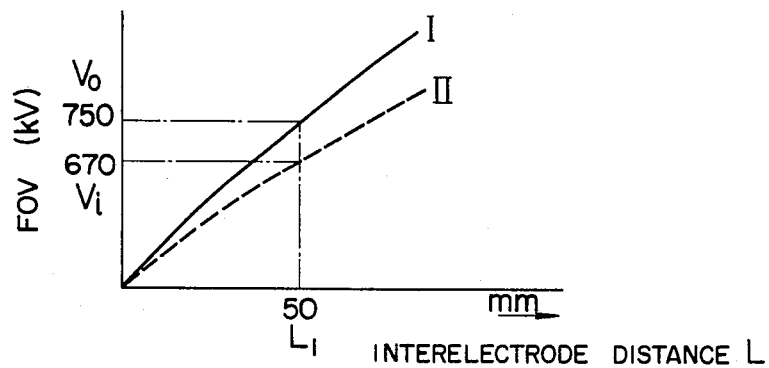
FIG. 10
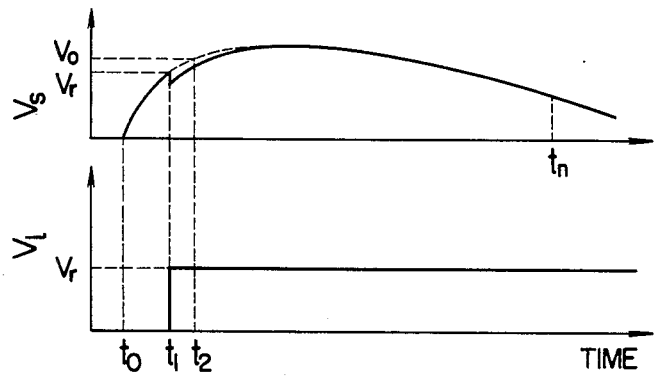
FIG. 11A
FIG. 11B
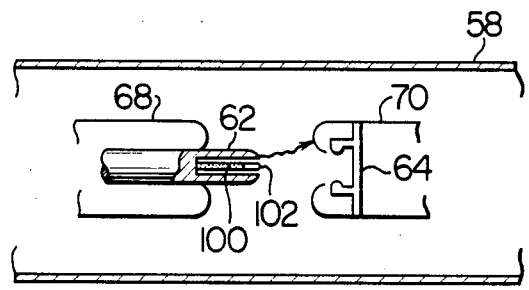
FIG. 12

METHOD OF TESTING AND VERIFYING A PERFORMANCE FOR INSULATION TO GROUND OF A DISCONNECTING SWITCH WHEN BREAKING A CHARGING CURRENT

The present invention relates to a method of testing insulation to ground for a disconnecting switch when breaking a charging current and is particularly suitable for testing a gas insulated disconnecting switch of the tank type.

The testing of the ability of a gas insulated disconnecting switch to disconnect a charging current is generally performed by means of a circuit which is approximately equivalent to the actual gas insulated disconnecting switch.

FIG. 1 shows an example of such an equivalent circuit. An AC power supply 2 is connected through a bus bar 4 to one terminal of a disconnecting switch 6 and a circuit breaker 10 is coupled through a bus bar 8 to the other. A power feeding system (not shown) is further connected through the bus bar 12 to the other end of the circuit breaker 10, thereby constructing the circuit. On the load side of the disconnecting switch 6, an electrostatic capacity $C_l$ is also provided between the bus bar 8 and the ground.

When the disconnecting switch 6 and the circuit breaker 10 are closed, a power current flows from the power supply 2 through the disconnecting switch 6 to the circuit breaker 10 and the capacity $C_l$, thereby charging.

When the circuit breaker 10 opens, a circuit is constructed such that only the electrostatic capacity $C_l$ of the bus bar 8 is applied to the load side of the disconnecting switch 6. When the disconnecting switch 6 is further opened in this state, the charging current across the load capacity $C_l$ is disconnected.

FIG. 2 shows transitions of a voltage $V_s$ on the power supply side and a voltage $V_l$ on the load side of the disconnecting switch 6 when breaking the charging current to the capacity $C_l$ by opening the disconnecting switch 6. In FIG. 2, the broken line shows the voltage $V_s$ on the power supply side and the solid line indicates the voltage $V_l$ on the load side.

When the disconnecting switch 6 is opened at time $t_s$, a gap distance between electrodes increases with the elapsed time. Now, for example, assuming that when the power voltage $V_s$ is 0 V, the disconnecting switch 6 is opened, a voltage across the capacity $C_l$ is also 0 V. Soon, when the power voltage becomes $v_1$ (the interelectrode gap distance is $l_1$) at time $t_1$, an interelectrode electric potential difference across the disconnecting switch 6 becomes $v_1$, so that a discharge (restriking of arc) occurs across the electrodes. Thus, the capacity $C_l$ is charged and a load voltage becomes $v_1$. Soon, when the interelectrode gap distance becomes $l_2$ ($l_2 > l_1$) and the power voltage becomes $v_2$ at time $t_2$, an electric potential difference between electrodes of the disconnecting switch becomes ($v_2 - v_1$) (wherein, $(v_2 - v_1) > v_1$). Thus, the restriking arc occurs again and the capacity is charged and the load voltage becomes $v_2$.

In this way, as the interelectrode gap distance increases with the elapsed time, the interelectrode electric potential difference which is needed to cause the restriking arc across the electrodes also increases; therefore, the time interval for the restriking gradually becomes long as shown in FIG. 2.

As a result of repetition of the striking arc in this way as described above, when the interelectrode voltage necessary for the discharge becomes a voltage between peak values of the power supply 2 pu (wherein, 1 pu represents a peak value of the power supply voltage $V_s$), the final restriking arc occurs and the breaking is completed as shown at time $t_{11}$ in FIG. 2. Thus, the load side voltage $V_l$ is maintained to be a constant value (1 pu, herein).

Upon restriking of arc, a surge voltage 16 occurs as shown in FIG. 2. Particularly, as shown in the drawing, when the restriking arc is performed between the peak values (2 pu) of an AC voltage, the surge voltage which is equivalent to 2.5 pu (i.e. n=2.5 in FIG. 2) may occur. Therefore, the disconnecting switch must satisfy insulation to ground requirements even under such condition. Thus, the tests for the disconnecting switch are carried out to examine properties of insulation to ground for a predetermined gap length, interelectrode voltage and surge voltage. However, in this test, even if the phase of a power supply voltage when opening the switch is set to be constant, the phase of the power supply voltage when the final restriking arc of the disconnecting switch is carried out differs for every test, so that a surge voltage to be caused does not become constant. In other words, the final restriking arc is not always performed at the peak of the power supply voltage. Therefore, to carry out the test which can satisfy the conditions that will be caused for an actual disconnecting switch, it is necessary to execute a great number of tests; this has a drawback in that it requires a large expenditure of money.

There has been proposed a simulation test method, as a method of eliminating such a drawback, in that a circuit as shown in FIG. 3 is constituted, thereby simulating only the state between times $t_{10}$ and $t_{12}$ of FIG. 2.

This method is disclosed, for example, in FIG. 16 of S. Nishiwaki, Y. Kanno, S. Satoh, E. Haginomori, S. Yamashita, S. Yanabu: "Ground Fault by Restriking Surge of SF$_6$ Gas-Insulated Disconnecting Switch and its Synthetic Tests," IEEE PES, Paper 82 WM 187-3, 1982.

According to this method, bushings 24 and 26 are arranged at both ends of the disconnecting switch 6, one end of the disconnecting switch 6 is connected through the bushing 24 to a power supply 20 and a capacitor 22 and the other end is connected through the bushing 26 to another power supply 36 and a capacitor 34, thereby carrying out the test using a circuit with such a construction. In FIG. 3, the power supply 36 is a DC voltage generator to simulate the load side voltage $V_l$, and the power supply 20 is an impulse voltage generator or a half-wave AC voltage generator, etc. to simulate the power supply voltage $V_s$ having a polarity opposite to that of the power supply 36. Reference numerals 28 and 30 indicate voltage dividers to detect, divide and fetch the power supply voltage $V_s$ and load voltage $V_l$, respectively. Outputs of the voltage dividers 28 and 30 are applied to a display unit, for example, oscilloscope 32, thereby indicating the waveforms of the power supply voltage $V_s$ and load voltage $V_l$.

In this test, an interelectrode distance of the disconnecting switch is first set to a length which is equal to the maximum arc length when breaking a charging current. Then, a DC voltage in response to a peak value of an AC output of the power supply 20 is applied from the power supply 36 to one contact of the disconnecting switch. Thereafter, a threshold voltage which corresponds to the waveform of ¼ cycle of an AC voltage having a polarity opposite to that of the DC voltage of the power supply 36 is applied from the power supply 20 to the other contact of the disconnecting switch. In this way, the state between the times $t_{10}$ and $t_{12}$ of FIG. 2 is simulated in the disconnecting switch of FIG. 3 to carry out the restriking.

As described above, the severest restriking arc condition for the disconnecting switch is simulated, and the insulation to ground at a surge voltage to be caused at this time is verified. According to this method, it is possible to perform the verification test sufficiently by selecting only the severest condition. However, there is such a drawback that the overall test facility of large scale is required due to the points such that two high-voltage power supplies are needed and that two bushings for high voltage are also necessary, or the like. In particular, a further larger scale test facility is required for UHV which is being developed recently, resulting in a great amount of test expenditure.

It is an object of the present invention to provide a method by which insulation to ground is tested during the breaking of a charging current by a disconnecting switch, wherein the test is simplified and requires facilities of a smaller scale than prior art tests.

The present invention provides a method of testing insulation to ground for a disconnecting switch when breaking a charging current, the disconnecting switch having a movable electrode and a fixed electrode which are arranged in a tank so as to face each other, one of said electrodes being connected to an electrostatic capacity load and the other one being connected to a power supply. The test method includes the steps of:

setting a distance between the movable and fixed electrodes to a selected distance value, generating an electrical potential with the power supply, the potential being of a predetermined magnitude associated with the selected distance value, applying the potential to the other electrode to cause a discharge across both electrodes, thereby enabling charge to be accumulated and stored in the capacity of the load;

applying a pulsed electrical potential generated by the power supply to the other electrode, the pulsed potential being of opposite polarity to the stored charge in the load thereby causing a second discharge across both electrodes; and verifying the satisfactory performance of the insulation to ground of the switch by monitoring the second discharge.

The present invention will be apparent from the following detailed description taken in conjunction with the accompanying drawings, in which:

FIG. 4 is a circuit diagram showing a typical embodiment of the gas-insulated disconnecting switch to carry out a verification test for insulation to ground according to the present invention;

FIGS. 5A to 5C are voltage waveform diagrams at each section in FIG. 4;

FIG. 10 is a characteristic diagram showing a test principle in accordance with FIG. 9;

FIGS. 11A and 11B are voltage waveform diagrams at each section in the embodiment shown in FIG. 9; and FIG. 12 is a cross sectional view of the disconnecting switch showing further another embodiment of the present invention.

Figure 1:
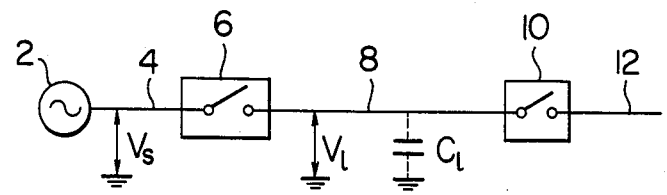
FIG. 1 is an equivalent circuit showing an example of a gas-insulated disconnecting switch to carry out a conventional verification test for insulation to ground.
Figure 3:
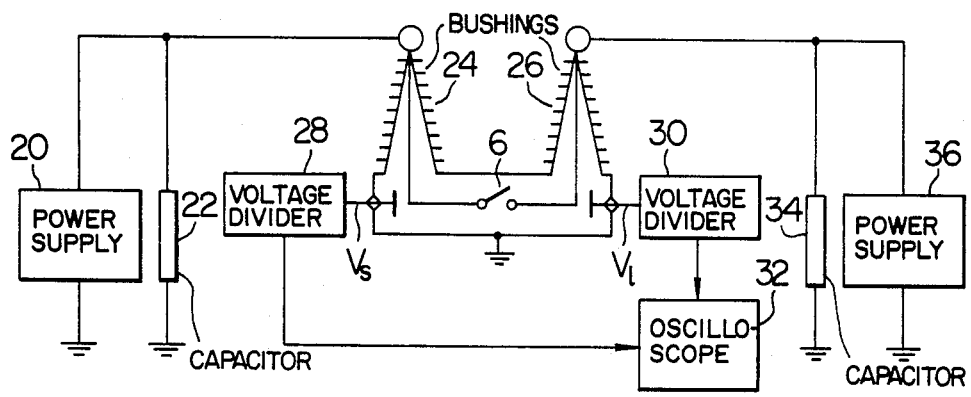
FIG. 3 is a circuit diagram showing another example of the gas-insulated disconnecting switch to carry out a conventional verification test for insulation to ground.

Referring to FIG. 4, there is shown a circuit diagram of a typical embodiment of a gas-insulated disconnecting switch to carry out a test for insulation to ground according to the present invention. In FIG. 4, parts and elements that have the same functions as those shown in FIGS. 1 and 3 are designated by the same reference numerals.

One electrode, i.e. a fixed electrode 64 of the disconnecting switch 6 enclosed in a tank, e.g. a grounded tank is connected to a central conductor 56 of a gas bus bar 54 which forms a load. An electrostatic capacity $C_l$ is formed between the central conductor 56 of the gas bus bar 54 and a high-voltage conductor 58. The central conductor 56 is insulated and supported by an insulating spacer 52. The other electrode, i.e. a movable electrode 62 of the disconnecting switch 6 is connected to a central conductor 55. The central conductor 55 is connected through the bushing 24 and a lead wire 50 to a power supply 40. The central conductor 55 is supported by an insulating spacer 53.

The power supply side voltage $V_s$ and load side voltage $V_l$ of the disconnecting switch 6 are detected and divided by the voltage dividers 28 and 30, respectively, and then applied to a waveform display unit, for instance, an oscilloscope 32.

The power supply 40 is a well-known power supply comprising: a power supply main body 42 having an equivalent electrostatic capacity $C_s$; an AC power supply 44; a voltage regulator 45 for regulating an output voltage of the AC power supply 44; a rectifier 46 for rectifying an output of the voltage regulator 45; a polarity changeover switch 47 for selectively switching a polarity of an output voltage of the rectifier 46; and a starter 48. The output of the rectifier is accumulated in the capacity $C_s$ of the power supply main body. When a trigger signal is applied from the starter 48, the charges accumulated in the capacity $C_s$ are discharged, so that a pulse-like high voltage as shown in FIG. 5A is applied through the bushing 24 to the movable electrode of the disconnecting switch 6. An output voltage of the power supply 40 can be regulated by the voltage regulator 45.

For a successful simulation of an actual power feeding system, a value of the capacity $C_s$ is set to a value which is at least one order of magnitude larger than that of $C_l$ with respect to a relation between the electrostatic capacity $C_l$ of the load side gas bus bar and the equivalent electrostatic capacity $C_s$ on the power supply side.

Figure 6:
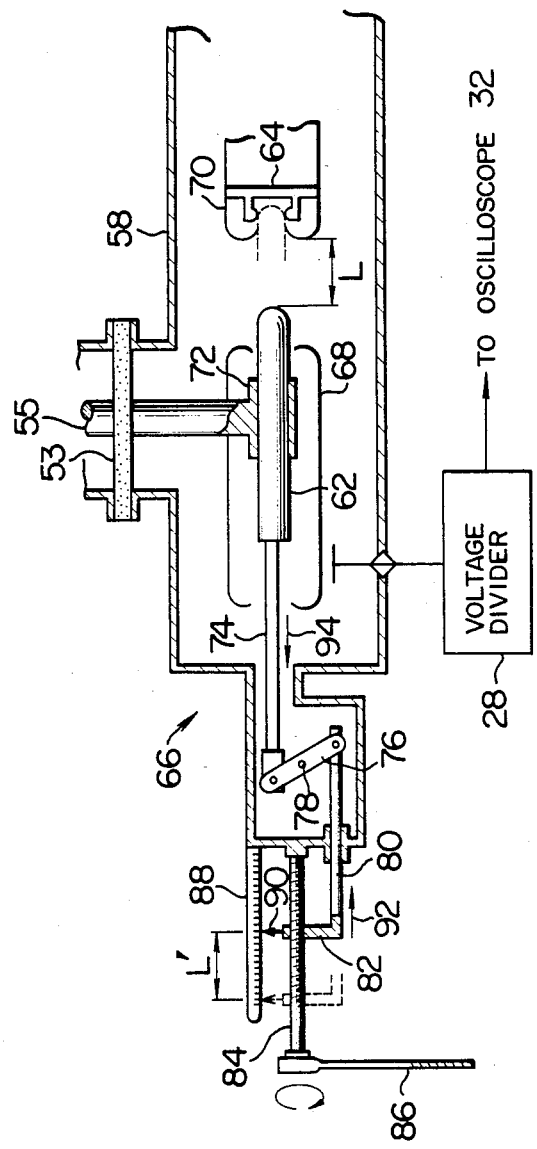
FIG. 6 is a cross sectional view illustrating a driving mechanism of movable electrodes in FIG. 4.

The movable electrode 62 can be manually moved by a driving apparatus 66, an example of which is illustrated in FIG. 6. A driving apparatus similar to that of FIG. 6 is shown, for example, in FIG. 2 in U.S. Pat. No. 4,263,491.

FIG. 6 is a detailed cross sectional view showing the disconnecting switch 6 and its driving apparatus 66 of FIG. 4. The disconnecting switch 6 includes the movable electrode 62 and fixed electrode 64 which are disposed in the high-voltage conductor 58 of the grounded tank, and shields 68 and 70 for reducing the electric field which are arranged around the electrodes 62 and 64. The movable electrode 62 is slidably supported to the inside of a conductive cylindrical member 72 fixed to the end portion of the central conductor 55. The central conductor 55 is supported by the insulating spacer 53.

The driving apparatus for sliding the movable electrode 62 will be now described. The end portion of the movable electrode engages one end of a link member 76 through an insulating operating rod 74. The link member 76 is rotatable around a fulcrum 78, and the other end of the link member is come into link engagement with one end of an operating rod 80. The other end of the operating rod 80 is L-shaped and a female screw portion 82 is formed therein. A needle 90 is attached to the edge of the rod 80. One end of the female screw portion 82 is rotatably supported to the high-voltage conductor 58 and the other end is adapted to threadably engage a male screw rod 84 coupled to a handle 86. A scale rod 88 is graduated at regular intervals for a distance L between the movable electrode 62 and the fixed electrode 64. This scale is determined by preliminarily obtaining a relation between a travelling amount L' of the needle 90 in association with the movement of the operating rod 80 and the distance L between the movable and fixed electrodes.

With such a construction, upon rotating the handle 86 clockwise, for example, the operating rod 80 moves in the direction indicated by an arrow 92. Thus, the operating rod 74 and, accordingly, the movable electrode 62 moves in the direction indicated by an arrow 94. The distance L between the electrodes at this time is a value indicated by the needle 90.

In this way, the interelectrode distance L can be set into any values by the operation of the handle 86. In case of a disconnecting switch which is commercially available, it is generally further provided with such an apparatus as to enable a remote controlling operation of the interelectrode distance using a motor or an air pressure in addition to the driving apparatus 66.

It will be now described a method of carrying out the verification test for insulation to ground using the disconnecting switch shown in FIGS. 4 and 6.

First, the interelectrode distance L of the disconnecting switch 6 is set to a certain value by means of the driving apparatus 66. Then, a pulse-like voltage as shown in FIG. 5A is applied at time $t_0$ from the power supply 40 to the disconnecting switch 6. When the power voltage reaches a predetermined value to be determined on the basis of the interelectrode distance L at time $t_1$, the discharge occurs across the electrodes, so that charges are accumulated in the gas bus bar on the load side. Hence, the power supply side voltage $V_s$ and load side voltage $V_l$ show the waveforms as shown in FIGS. 5B and 5C. That is to say, the discharge is done across the electrodes at time $t_1$ and the DC voltage $V_l$ as shown in FIG. 5C is trapped in the load side bus bar 56. A discharge time constant of this residual voltage (i.e. the trapped charged voltage) is determined due to electrostatic capacity $C_l$ of the load side bus bar 56 and insulation resistance of the insulating spacer 52 which insulationsupports the high-voltage conductor 58 or the like. The above-mentioned discharge time constant is in the order of few hours to few days, because the insulation resistances of a spacer and the like that will be generally used in a gas-insulated apparatus are extremely higher than that of a spacer that will be used in the atmosphere. That is to say, a capacity of the insulating spacer in the gas-insulated apparatus is large, while inductance and resistance components are small, so that the residual voltage can be held without being attenuated. Therefore, as far as the insulation-to-ground test is carried out within tens of minutes after the residual charges have been formed into the load side bus bar 56, the residual voltage across the load side bus bar will be hardly reduced and the voltage at the time of discharge is held as it is. Therefore, there is no need to consider a reduction of a load residual voltage.

In accordance of such a method as described above, it is possible to trap an arbitrary DC voltage on the load side by suitably changing the interelectrode distance of the disconnecting switch and the voltage to be applied. Thus, there is no need to additionally provide a DC power supply on the load side as in a conventional method.

A performance for insulation to ground when breaking a charging current of such a disconnecting switch is determined by a performance against a restriking arc surge that will be caused at the location of the movable electrode which is the maximum arc distance. The restriking arc surge becomes highest at the time of restriking arc, as described previously, in the case where an AC peak value voltage of a positive polarity and a peak value voltage of a negative polarity are applied across the electrodes. Therefore, to carry out verification of a performance on insulation to ground, a distance between the electrodes of the disconnecting switch is first set into a predetermined value and a DC voltage is trapped on the load side according to the above-mentioned procedures. Then, the interelectrode distance is increased to a predetermined length and a voltage having the same level as and the polarity opposite to the residual voltage is applied from the power supply side, thereby causing the discharge across the electrodes, and then the insulation to ground at that time is verified.

Figure 7:
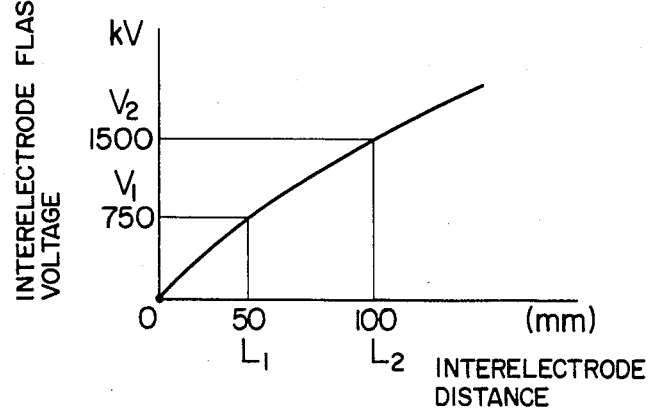
FIG. 7 is a diagram showing a relation between an interelectrode distance in the disconnecting switch and a flashover voltage.

In this method, since a predetermined DC voltage is first trapped in the load, a pulse-like voltage as shown in FIG. 5A is applied from the power supply side by setting the interelectrode distance L to a predetermined length. In this case, as shown in FIG. 7, a relation between the interelectrode distance L and the flashover voltage V is preliminarily obtained, thereby determining the interelectrode distance L and the flashover voltage V from this relation. FIG. 7 shows a characteristic in the system of the class of 300 KV.

By such a method, a predetermined DC voltage is trapped on the load side, thereafter the interelectrode distance is increased to an interelectrode distance which is equal to the maximum arc length or the like. Then the polarity of the power supply 40 is changed by the polarity change-over switch 47 so that it is opposite to the polarity of the DC voltage that has been already trapped, and then a predetermined voltage which has been determined by the voltage regulator 45 is applied.

Figure 8:
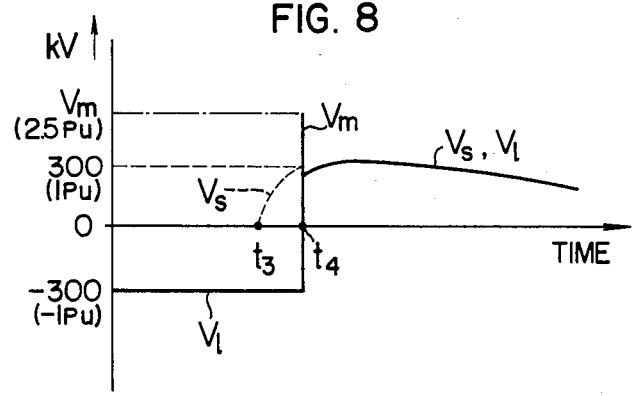
FIG. 8 is a voltage waveform diagram showing a principle of the insulation-to-ground test according to the present invention.

FIG. 8 is a waveform diagram of the power supply side and load side voltages $V_s$ and $V_l$ in the system of the 300 KV class. The load side voltage $V_l$ is the voltage trapped in the electrostatic capacity $C_l$ of the load side bus bar due to the interelectrode discharge, and it is about $-300$ KV ($-1$ pu). Then, after increasing the interelectrode distance, a pulse-like voltage $V_s$ of a negative polarity is applied at a peak value of 300 KV (1 pu) at time $t_3$. When the voltage $V_s$ reaches a peak level (300 KV, i.e. a flashover voltage) at time $t_4$, the discharge occurs across the electrodes and a surge voltage $V_m$ is caused. At this time, the surge voltage is about 2.5 pu. In this case, the time period between $t_3$ and $t_4$ is about 200–500 μs.

Figure 2:
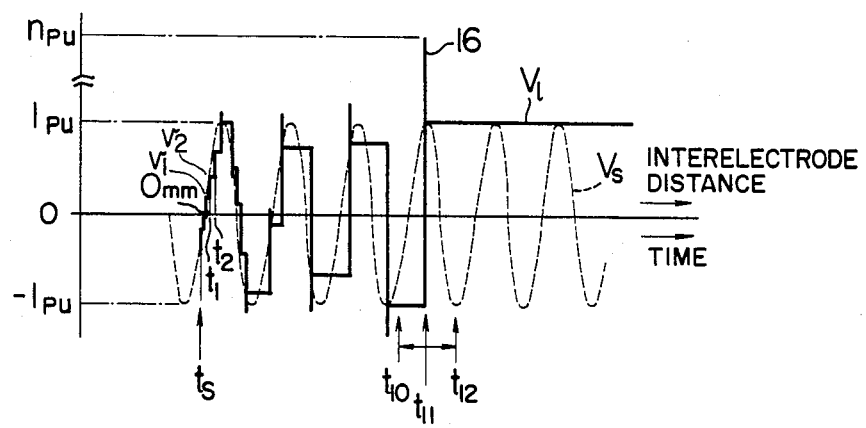
FIG. 2 is a voltage waveform diagram when breaking a charging current in the equivalent circuit of FIG. 1.

This situation is a completely simulated form of the final restriking arc (at time period of $t_{10}$–$t_{12}$) in FIG. 2. At this time, it is possible to perform the verification for insulation to ground due to the surge voltage $V_m$ to be caused. It is most preferable to use a leading waveform (time period: 5 ms) which is equal to ¼ cycle of the AC voltage as the waveform of a power supply voltage to be applied to the disconnecting switch 6; however, the insulation-to-ground verification can be sufficiently carried out even if a high-frequency pulse waveform (time period: 1–2 μs) may be used.

According to the present method, the test is possible with single power supply and one bushing, and therefore, the verification test similar to a conventional one can be carried out by means of a testing apparatus of a small scale.

In the above-described method, a fluctuation of a DC residual voltage on the load side is large, because its control depends on an interelectrode distance between the movable and fixed electrodes. This is because a polarity effect is generally caused at the time of discharge since the construction of both electrodes of a disconnecting switch is asymmetrical. In other words, even when the discharge is once caused across the electrodes to form a residual voltage in the gas bus bar of one electrode, the interelectrode discharge may occur due to reverse flashover (which discharges from the load side electrode to power supply side electrode due to a residual DC voltage) and dark current in accordance with the polarity of residual voltage.

For example, an interelectrode voltage, that is needed for a discharge in the case where the movable electrode is negative polarity and the fixed electrode is positive polarity, is lower than that in the case where the movable electrode is positive polarity and the fixed electrode is negative polarity. Thus, for example, after a power voltage $V_s$ shown in FIG. 5A has been applied for allowing a voltage shown in FIG. 5C to be trapped in the load, when the power voltage V reduces and becomes $V_n$, the interelectrode electric potential difference becomes $V_0 - V_n$, so that the reverse flashover occurs.

Therefore, as a method of preventing such an undesirable discharge, the first discharge is performed with the polarity at which the discharge due to a reverse flashover and dark current is hard to occur, that is to say, a negative power voltage having a peak value $V_0$ is applied to the electrode of the power supply side, thereby trapping a DC voltage of negative polarity on the load side. In this state, a potential of the movable electrode is higher than that of the fixed electrode, so that the discharge will not occur until the interelectrode potential difference becomes a value higher than $V_0$. Thereafter, a voltage of the opposite polarity (+polarity) is applied to the movable electrode to perform the second discharge.

As described above, suitable selection of the polarity of the power voltage allows the interelectrode voltage which is necessary for the first discharge, i.e. the discharge from the movable electrode to fixed electrode to be lower than the voltage that is needed for the discharge (reverse flashover or the like) from the fixed electrode to movable electrode due to the residual voltage. Hence, the reverse flashover is difficult to occur. At this time, the interelectrode distances in the first and second discharges may be equal, or the interelectrode distance in the second discharge may be longer than that in the first one.

Figure 9:
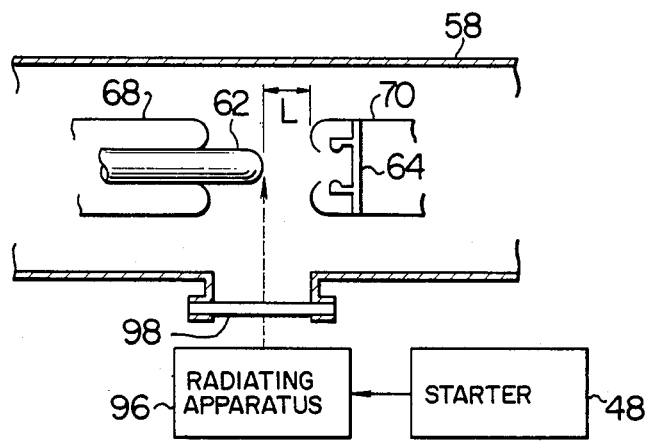
FIG. 9 is a cross sectional view of the disconnecting switch showing another embodiment of the present invention.

FIG. 9 is a cross sectional view of the disconnecting switch showing another embodiment of a test method of the present invention. In the embodiment of FIG. 9, the discharge due to the above-mentioned reverse flashover and dark current is prevented. In this embodiment, a window 98 is provided at the side surface of the high-voltage conductor 58 of the grounded tank, and a beam, such as ultraviolet rays, radioactive rays and laser beam, generated from a radiating apparatus (mercury lamp, laser generator, etc.) 96 can be irradiated through the window 98 into the region between the electrodes 62 and 64. FIG. 10 shows characteristics of the interelectrode discharge with respect to presence and absence of irradiation of the beam into the region between the electrodes.

In FIG. 10, the solid line I and broken line II indicate the relations between the interelectrode distance L and the flashover voltage FOV in the case where no beam is radiated and in the case where a light beam is radiated, respectively. As will be understood in FIG. 10, it is possible to reduce the flashover voltage by about 10% by radiating a light beam with respect to the same interelectrode distance L to thereby ionizing gas of radiated area. For instance, in the system of 300 KV class, when the interelectrode distance is set to $L_1$ (50 mm), it is possible to reduce the flashover voltage from $V_0$ (750 KV) to $V_i$ (670 KV) by radiating a light beam. Namely, in case of the interelectrode distance of $L_1$, a power voltage shown in FIG. 11A is applied to the movable electrode. At this time, the radiation of a light beam from the radiating apparatus 96 to the head portion of the movable electrode 62 causes the flashover voltage to reduce from $V_0$ to $V_i$, so that the discharge is started at time $t_1$ (FIG. 11B). In this way, a voltage $V_i$ is trapped on the load side. In this state, a light beam is radiated to only the movable electrode and no beam is radiated to the fixed electrode, so that a voltage that is required for the discharge from the fixed electrode to movable electrode is $V_0$ and consequently no reverse flashover will be caused.

It will be now described the case where a beam is radiated to the region between the movable and fixed electrodes. In this case, both flashover voltage for discharging from the movable electrode to fixed electrode and flashover voltage for discharging from the fixed electrode to movable electrode reduce from $V_0$ to $V_i$. Thus, for the first discharge, a light beam is radiated from the radiating apparatus 96 only in the period of time when the wave front portion of the power voltage $V_s$ (corresponding to time $t_0$–$t_1$ of FIG. 11A) exists. At this time, the discharge occurs from the movable electrode to fixed electrode at time $t_1$, so that a voltage $V_i$ is trapped in the load. The beam radiation is now finished and the flashover voltage for discharging from the fixed electrode to movable electrode increases to $V_0$, so that no reverse flashover will be caused. The radiating apparatus 96 radiates a light beam for only a predetermined period of time $t_0$–$t_1$ in response to a trigger signal from the starter 48 synchronously with the time when the power voltage $V_s$ is applied.

Now, the reverse flashover will be caused when the power voltage $V_s$ becomes almost zero before ionized gas reacts completely. Thus, it is preferable to set the wave tail of the power voltage $V_s$ sufficiently long such that the voltage $V_s$ becomes almost zero after the ionized gas reacts completely so as to prevent the reverse flashover.

FIG. 12 shows another embodiment of the test method by which the discharge due to reverse flashover and dark current is prevented. In this embodiment, the inside of the head portion of the movable electrode 62 shown in FIG. 6 is hollowed out and a conductive trigger electrode 102 supported by an insulated supporting member 100 is attached into the hole. With such a construction, when the power voltage $V_s$ is applied from the power supply to the movable electrode, a potential difference is caused at its wave front portion (which corresponds to time $t_0$-$t_1$ of FIG. 11A) between the trigger electrode 102 and the movable electrode 62 due to electrostatic capacity therebetween, so that the discharge occurs therebetween. Thus, the flashover voltage for discharging from the movable electrode to fixed electrode reduces by about 10% due to this discharge, causing the interelectrode discharge at a lower level (e.g. $V_i$ at time $t_1$ of FIG. 11A) of the power voltage $V_s$, so that the voltage $V_i$ is trapped in the load. Once the discharge occurs, a DC electric field is caused between the trigger electrode and the movable electrode, so that a potential difference therebetween will disappear. Therefore, upon starting the interelectrode discharge, the discharge between the trigger electrode and the movable electrode disappears, this causes the flashover voltage between electrodes to increase to $V_0$. Thus, the flashover voltage for discharging from the fixed electrode to movable electrode becomes $V_0$, thereby preventing the reverse flashover.

In each of the above-described embodiments, a power voltage of $-V_i(-1$ pu$)$ is applied to the disconnecting switch when carrying out the second discharge, thereby performing the test for insulation to ground. The interelectrode distances at the first and second discharges may be identical, or the distance upon the second discharge may be larger than that of the first one.

In the case where the same power voltage is used, the interelectrode distance can be set to be long by way of radiating a light beam at the time of the first discharge or by providing the movable and trigger electrodes as described above. Therefore, it is possible to form a stable residual voltage without any fluctuation.

In the above-described embodiments, although the movable electrode was used on the power supply side, it may be possible to use the movable electrode on the load side and the fixed electrode on the power supply side.

Although the trigger electrode is provided in the movable electrode in the embodiment of FIG. 12, it may be provided in the fixed electrode.

According to the above-described method, the discharge due to reverse flashover or dark current after a DC voltage has been trapped can be easily prevented and the DC residual voltage can be easily controlled, this results in an improvement in efficiency of the test.

According to the present invention, the verification for insulation to ground when breaking a charging current of the disconnecting switch can be carried out with a small-scale facility using a single power supply and only one bushing; therefore, its application effect will be larger against the disconnecting switch with a higher rated voltage. In particular, for the disconnecting switch of UHV class, since a price of a bushing is extremely expensive, the present invention can advantageously provide a large effect as a test method using one bushing.

We claim:

1. A method of testing insulation to ground for a disconnecting switch when breaking a charging current, said disconnecting switch having a movable electrode and a fixed electrode which are arranged in a tank so as to face each other, one of said electrodes being connected to an electrostatic capacity load and the other electrode being connected to a power supply, said test method comprising:

a first step of setting a distance between said movable and fixed electrodes to a selected distance value, generating an electrical potential with said power supply, said potential being of a predetermined magnitude associated with said selected distance value, applying said potential to said other electrodes to cause a discharge across both electrodes, thereby enabling charge to be accumulated and stored in the capacity of said load;

a second step of applying a pulsed electrical potential generated by said power supply to said other electrode, said pulsed potential being of opposite polarity to said stored charge in said load thereby causing a second discharge across both electrodes; and a third step of verifying the satisfactory performance of the insulation to ground of said switch by monitoring said second discharge.

2. A test method according to claim 1, wherein a distance between said movable electrode and said fixed electrode when applying the pulsed electrical potential in said second step is larger than the interelectrode distance when applying the electrical potential in said first step.

3. A test method according to claim 2, wherein a beam is radiated between said movable electrode and said fixed electrode while applying the electrical potential to said disconnecting switch in said first step.

4. A test method according to claim 3, wherein said beam is directed only onto a head portion of said electrode which is connected to said power supply.

5. A test method according to claim 3, wherein said beam is directed into a region between both electrodes for a predetermined period of time synchronously with the time when the potential is applied from said power supply to said disconnecting switch in said first step.

6. A test method according to claim 2, wherein a trigger electrode is attached to a head portion of one of said electrodes through an insulation member.

7. A test method according to claim 2, wherein said electrostatic capacity load is a gas-insulated bus bar and a central conductor of the bus bar is supported in a grounded tank by an insulation member.

8. A test method according to claim 2, wherein said power supply has an electrostatic capacity which is larger than the electrostatic capacity of said electrostatic capacity load.

9. A test method according to claim 2, wherein a time constant of a trailing edge of said pulsed electrical potential to be applied in said second step is set to be substantially longer than the time required for flashover to occur.

* * * * *